(12) United States Patent
Nakagawa et al.

(10) Patent No.: US 12,047,062 B2
(45) Date of Patent: Jul. 23, 2024

(54) ELECTRONIC CIRCUIT AND SENSOR SYSTEM

(71) Applicant: Hitachi Astemo, Ltd., Hitachinaka (JP)

(72) Inventors: Tatsuo Nakagawa, Tokyo (JP); Akeo Satoh, Hitachinaka (JP); Akira Kotabe, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 149 days.

(21) Appl. No.: 17/595,051

(22) PCT Filed: Apr. 3, 2020

(86) PCT No.: PCT/JP2020/015264
§ 371 (c)(1),
(2) Date: Nov. 8, 2021

(87) PCT Pub. No.: WO2020/241046
PCT Pub. Date: Dec. 3, 2020

(65) Prior Publication Data
US 2022/0216867 A1  Jul. 7, 2022

(30) Foreign Application Priority Data
May 31, 2019  (JP) ................................ 2019-102665

(51) Int. Cl.
*H03K 17/687* (2006.01)
*G01R 31/50* (2020.01)
(52) U.S. Cl.
CPC ......... *H03K 17/6871* (2013.01); *G01R 31/50* (2020.01)

(58) Field of Classification Search
CPC ................ H03K 17/6871; G01R 31/50; G01R 31/2829
See application file for complete search history.

(56) References Cited

U.S. PATENT DOCUMENTS 5,473,253 A  12/1995 Araki
6,407,620 B1  6/2002 Hirayama
(Continued)

FOREIGN PATENT DOCUMENTS

JP  6-208693 A  7/1994
JP  11-214933 A  8/1999
(Continued)

OTHER PUBLICATIONS

International Search Report (PCT/ISA/210) issued in PCT Application No. PCT/JP2020/015264 dated Jun. 23, 2020 with English translation (seven (7) pages).
(Continued)

*Primary Examiner* — Metasebia T Retebo
(74) *Attorney, Agent, or Firm* — Crowell & Moring LLP

(57) ABSTRACT

An electronic circuit that recognizes a disconnected state from an outside during disconnection of a power supply line is provided. For this purpose, an electronic circuit includes: a load provided between a power supply line and an output terminal in the electronic circuit; a transistor provided between the load and the output terminal; a current generation circuit that generates current using a power supply voltage at a power supply line in the electronic circuit; and a control circuit that controls the transistor using a control voltage that changes according to the current generated by the current generation circuit.

8 Claims, 8 Drawing Sheets

(56) References Cited

U.S. PATENT DOCUMENTS

| | | | |
|---|---|---|---|
| 2001/0030557 A1* | 10/2001 | Niimi | H03K 17/063 327/108 |
| 2004/0189323 A1 | 9/2004 | Nagase | |
| 2016/0191045 A1 | 6/2016 | Ozono | |
| 2019/0044376 A1 | 2/2019 | Senoue | |
| 2019/0152524 A1* | 5/2019 | Fujita | G01B 7/30 |

FOREIGN PATENT DOCUMENTS

| | | | | |
|---|---|---|---|---|
| JP | 2001-298849 A | | 10/2001 | |
| JP | 2004-301670 A | | 10/2004 | |
| JP | 2005-252968 A | | 9/2005 | |
| JP | 2005252968 A | * | 9/2005 | |
| JP | 2007-295209 A | | 11/2007 | |
| JP | 2008-29067 A | | 2/2008 | |
| JP | 2010-216996 A | | 9/2010 | |
| JP | 2013016959 A | * | 1/2013 | |
| JP | 2016-70835 A | | 5/2016 | |
| JP | 2016-122965 A | | 7/2016 | |
| JP | 2017-191093 A | | 10/2017 | |
| WO | WO 2017/179158 A1 | | 10/2017 | |

OTHER PUBLICATIONS

Japanese-language Written Opinion (PCT/ISA/237) issued in PCT Application No. PCT/JP2020/015264 dated Jun. 23, 2020 (five (5) pages).

Japanese-language Office Action issued in Japanese Application No. 2019-102665 dated May 30, 2023 with English translation (11 pages).

Japanese-language Office Action issued in Japanese Application No. 2019-102665 dated Nov. 7, 2023 with English translation (6 pages).

* cited by examiner

ELECTRONIC CIRCUIT AND SENSOR SYSTEM

TECHNICAL FIELD

The present invention relates to an electronic circuit and a sensor system, and for example, relates to an on-vehicle semiconductor electronic circuit and a sensor system.

BACKGROUND ART

A semiconductor electronic circuit on which an output circuit that outputs a signal measured by a sensor or the like is mounted is widely used. For example, sometimes the output circuit in an in-vehicle semiconductor electronic circuit is transmitted to an engine control unit (ECU) or the like through an output wiring. A power supply line is generally connected to the semiconductor electronic circuit such as a sensor, and power is supplied from an outside.

PTL 1 discloses a conventional technique in this technical field. PTL 1 discloses a configuration which aims to prevent an erroneous detection of a short-circuit of the output, and in which when a load is in an open state, an output terminal voltage is limited to a voltage generated using a current source and a clamp circuit so as to prevent an erroneous detection of a short-circuit.

CITATION LIST

Patent Literature

PTL 1: JP 2016-122965 A

SUMMARY OF INVENTION

Technical Problem

However, PTL 1 does not consider the case where the power supply line is disconnected.

When the power supply line is disconnected, it is necessary to be able to recognize the disconnection on the ECU side. More specifically, when the ECU side is connected to the power supply by a pull-up resistor, it is required that output impedance of the output circuit becomes high impedance during disconnection of the power supply, that current inflow to the output terminal is prevented, and that the output terminal voltage becomes a voltage substantially equal to the power supply voltage. Because the output terminal voltage becomes substantially equal to the power supply voltage in this manner, the ECU side can recognize that the power supply line is disconnected.

However, during the disconnection of the power supply line, because a path through which current flows exists in the output terminal and the power supply line in the output circuit, sometimes the current flows from the output terminal into the output circuit and the output terminal voltage becomes intermediate potential. In order to recognize the disconnection of the power supply line on the ECU side, it is necessary to suppress the current inflow and the intermediate potential, to set the output impedance to high impedance, and to set the output terminal voltage to a high level.

In addition, even when the power supply line is disconnected, sometimes electric charge remains in the power supply line in the output circuit and the power supply voltage does not drop to the ground level, or sometimes it take a very long time for the power supply voltage to decrease. Accordingly, because the power supply voltage becomes the intermediate potential even when the power supply line is disconnected, it is difficult to use the power supply voltage as the control voltage. Even when such the power supply voltage is the intermediate potential, there is a problem in that current inflow from the output terminal to the power supply line in the output circuit and the intermediate potential of the output terminal are suppressed to output the high level.

The present invention has been made in view of such circumstances, and it is an object of the present invention to provide an electronic circuit and a sensor system that, when the power supply line supplied to the semiconductor circuit is disconnected, suppress the current inflow from the output terminal to the power supply line in the output circuit and the intermediate potential of the output terminal, set the output impedance to the high impedance, and set the output terminal voltage to the voltage substantially equal to the voltage connected on the external circuit side.

Solution to Problem

In view of the above background art and problems, an electronic circuit according to one aspect of the present invention includes: a load provided between a power line and an output terminal in the electronic circuit; a transistor provided between the load and the output terminal; a current generation circuit that generates current using a power supply voltage at a power line in the electronic circuit; and a control circuit that controls the transistor using a control voltage that changes according to the current generated by the current generation circuit.

Advantageous Effects of Invention

According to the present invention, the electronic circuit and the sensor system that improve the accuracy of disconnection detection can be provided.

DESCRIPTION OF EMBODIMENTS

Hereinafter, embodiments of the present invention will be described in detail with reference to the drawings. A circuit element constituting each functional block of the embodiments is not particularly limited, but is formed on a semiconductor substrate such as single crystal silicon by a known integrated circuit technology such as a complementary MOS (CMOS) transistor.

First Embodiment

Figure 1:
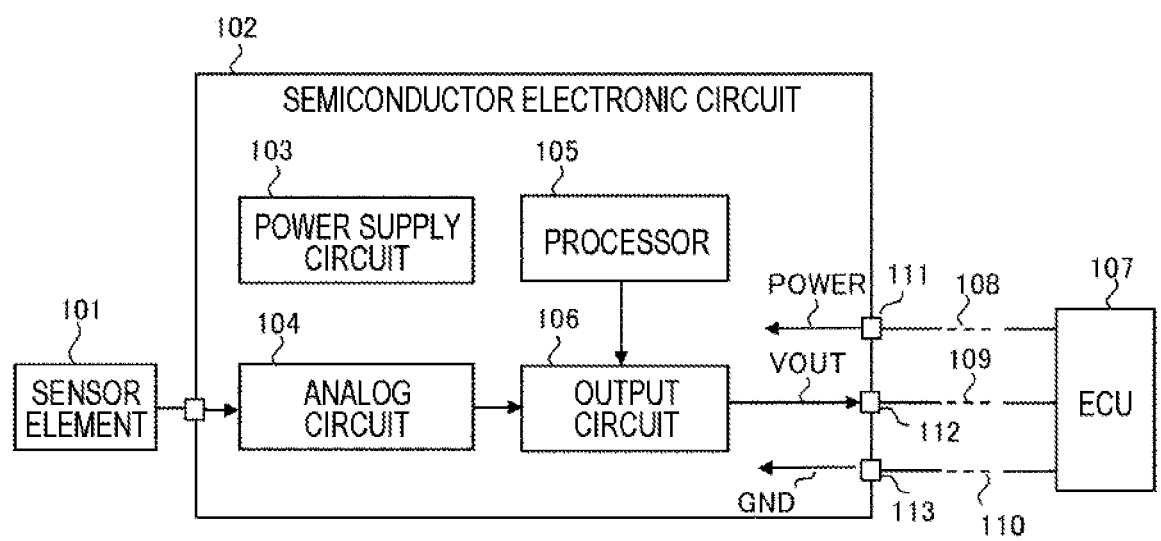
FIG. 1 is a schematic configuration diagram illustrating a sensor system according to a first embodiment.

FIG. 1 is a schematic configuration diagram of a sensor system according to a first embodiment. For example, the sensor system in FIG. 1 is an in-vehicle sensor system, and includes a sensor element 101, a semiconductor electronic circuit 102, and an ECU 107.

The sensor element 101 is an element in which an electrical characteristic changes according to a physical quantity, and outputs an electric signal according to a change in a detection target. For example, the sensor element 101 is an air flow sensor or the like that is an element that measures an air amount taken in by an engine, but is not particularly limited to the air flow sensor. That is, the sensor element 101 converts the physical quantity such as an air flow rate, a temperature, humidity, and pressure into the electric signal and outputs the electric signal.

The semiconductor electronic circuit 102 includes a power supply circuit 103, an analog circuit 104, a processor 105, and an output circuit 106, and for example, includes one semiconductor chip. The semiconductor electronic circuit 102 mainly performs processing on the electric signal from the sensor element 101, and outputs a processing result as a single edge nibble transmission (SENT) signal, a frequency modulation output signal, or the like through the output circuit 106. The circuit may be a circuit that outputs an analog signal voltage.

The analog circuit 104 performs processing such as amplification, filtering, analog-digital conversion, and digital-analog conversion on the electric signal from the sensor element 101. The processor 105 performs the processing on digital data, controls a peripheral circuit, and the like. The power supply circuit 103 generates an internal power supply from an external power supply, and distributes the internal power supply to each circuit. The output circuit 106 receives the processing result from the analog circuit 104 or the processor 105, and outputs an output signal (for example, a SENT signal) VOUT to the ECU 107 through an output terminal 112 and an output wiring 109. A power supply POWER is supplied from the ECU 107 or another external device through a power supply line 108 and a power supply terminal 111, and connected to a ground GND through a ground terminal 113. At reference numeral 110 denotes a ground wiring.

Figure 2:
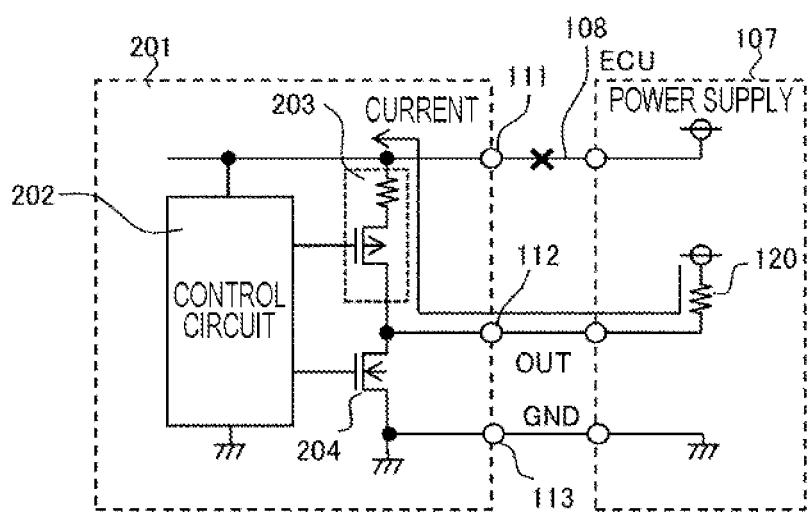
FIG. 2 is a schematic configuration diagram of a conventional output circuit.

FIG. 2 is an example of a conventional output circuit. An output circuit 201 includes a control circuit 202, loads 203, 204, the power supply terminal 111, and the output terminal 112. The power supply line 108 is connected to the power supply terminal 111, and power is supplied from the outside such as the ECU. An output line is connected to the output terminal 206, and transmits the output signal to an external controller such as the ECU. This output line is connected to a predetermined voltage through a pull-up resistor 120 in an interface circuit of the ECU. For example, the predetermined pull-up resistor 120 is 1 kΩ to several tens of kΩ. During normal operation, the loads 203, 204 are controlled by the control circuit 202 in order to output data reflecting a sensor signal or the like.

Figure 3:
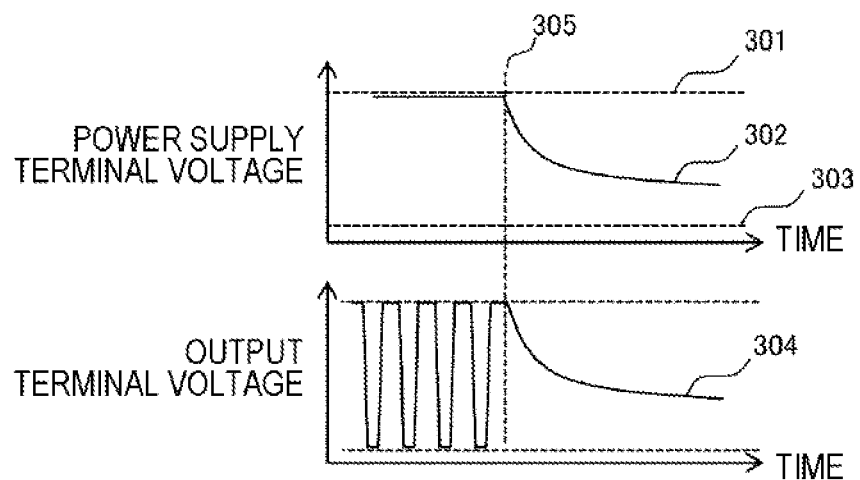
FIG. 3 is an operation waveform diagram illustrating the conventional output circuit during operation and during disconnection of a power supply line.

At this point, sometimes the power supply line 108 is disconnected due to external physical force, aging, or the like. FIG. 3 illustrates a voltage waveform when the power supply line is disconnected from an operation state. In FIG. 3, the upper waveform indicates the voltage at the power supply terminal, the lower waveform indicates the voltage at the output terminal. FIG. 3 illustrates the waveform when the power supply line is disconnected at timing of 305 from the operation state.

When the power supply line 108 is disconnected, power is not supplied to the output circuit 201. However, because the output line is connected to a predetermined voltage through the pull-up resistor 120 on the ECU side, the current flows from the output terminal to the power supply line in the output circuit through the load as illustrated in FIG. 2. When the load is a PMOS FET, sometimes current flows through a parasitic diode between a drain and a back gate. The output resistance of the output terminal is designed to be about several tens of Ω to 1 kΩ in order to drive the output line or to enhance noise resistance. Accordingly, because the resistance is lower than that of the pull-up resistor, the output terminal voltage does not become the predetermined voltage that is pulled up, but becomes an intermediate potential (304).

The sensor electronic circuit is required to have a diagnosis function during failure. When the power supply line is disconnected to supply no power to the sensor electronic circuit, it is necessary to recognize that the power supply line is disconnected by the external circuit. More specifically, the disconnection state can be recognized by fixing the output signal to a high potential different from a normal potential.

On the ECU side, when the power supply line is disconnected, the output terminal voltage is required to be a predetermined voltage in order to recognize that the power supply line is disconnected. Specifically, the output resistance of the output circuit is required to be high, and the pull-up voltage is required to be substantially equal to the voltage connecting the pull-up resistor. When the output terminal voltage becomes the pull-up voltage, it can be recognized that the power supply line is in the disconnected state. However, as described above, in the conventional circuit, the output terminal voltage becomes an intermediate potential, and it cannot be recognized that the power supply line is in the disconnected state.

In addition, as illustrated in FIG. 3, when the power supply line is disconnected from the state in which the sensor circuit is operated by the supply of the power, an electric charge is accumulated in the power supply of the output circuit. For this reason, in the power supply terminal, the voltage decreases from the power supply voltage (301) to a certain extent, but it takes a considerable time to decrease to the ground level (303). That is, the power supply terminal voltage is also in an intermediate potential state (302). Because it is necessary for the ECU side to recognize that the power supply line is in the disconnected state, it is necessary for the output terminal voltage to become a high level without waiting for the decrease in the power supply terminal voltage. That is, it is a problem to recognize that the power supply line is disconnected even when the power supply terminal voltage is in the intermediate potential.

Figure 4:
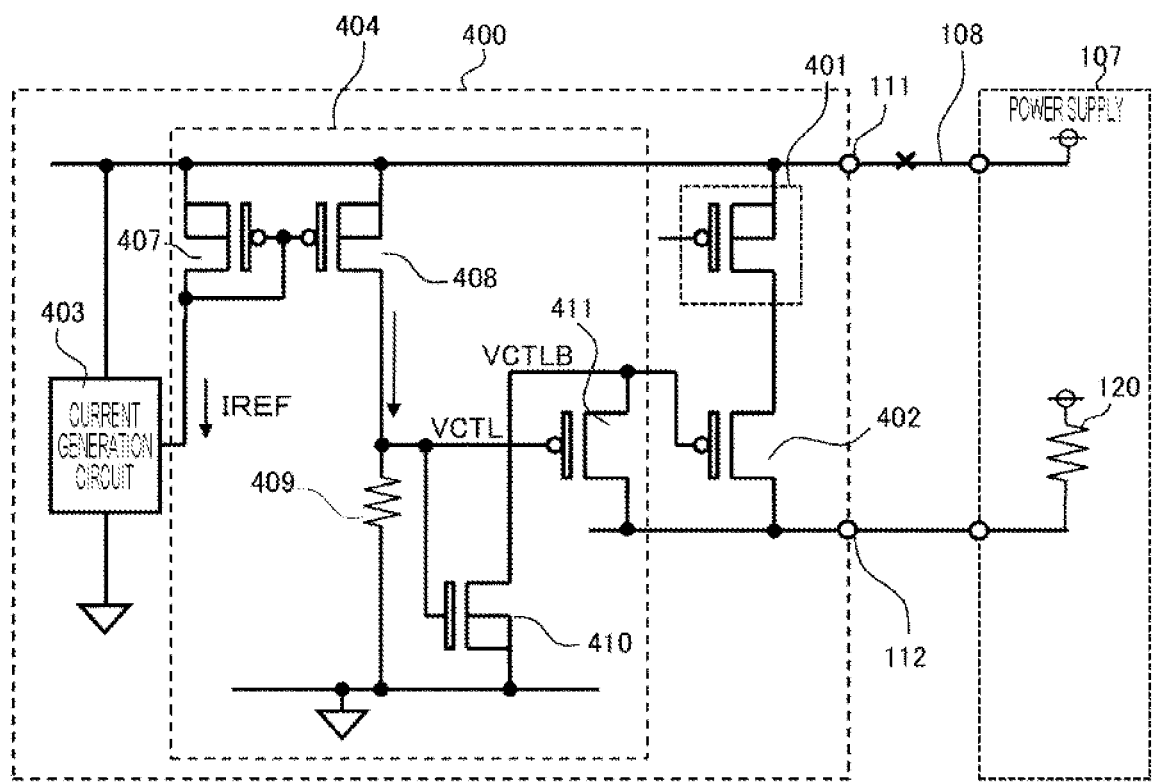
FIG. 4 is a schematic configuration diagram illustrating an electronic circuit of the first embodiment.

FIG. 4 is a schematic configuration diagram illustrating an electronic circuit equipped with an output circuit in the first embodiment. In FIG. 4, an electronic circuit 400 includes a load 401, a transistor 402, a current generation circuit 403, a current-voltage conversion circuit 404, the power supply terminal 111, and the output terminal 112. The current-voltage conversion circuit 404 includes a current mirror circuit including PMOS FETs 407, 408, a resistor 409, an NMOS FET 410, and a PMOS FET 411.

During the normal operation, the current generation circuit 403 generates a reference current IREF using the power from the power supply terminal 111. The reference current is mirrored by the current mirror circuit, and converts the current into the voltage by the resistor 409. A control signal VCTL during the operation becomes a high level. Because this voltage is inverted by the NMOS FET 410, the gate voltage at the transistor 402 is controlled by a low-level signal, so that the transistor 402 is turned on. In addition, because the gate voltage at the PMOS FET 411 becomes the high level, the PMOS FET is turned off.

Accordingly, during the normal operation, the transistor 402 is controlled to be turned on, the output line is driven by the load 401, and the signal is output from the output terminal 112.

An operation in the case where the power supply line is disconnected will be described below. When the power supply line 108 is disconnected, the electronic circuit continues the operation for a certain period by the charge accumulated in capacitance on the electronic circuit side of the power supply line disconnected portion. In the electronic circuit, the power supply voltage decreases because electric charge is consumed by the circuit, and the circuit cannot be operated as the power supply voltage decreases. In the output circuit, when the operation of the circuit stops, consumption of the current rapidly decreases. Specifically, the circuit operation stops around a voltage at which the power supply voltage in the electronic circuit decreases to around the threshold voltage corresponding to the number of stages in which the transistors are stacked vertically. When the current consumption decreases, the voltage itself is less likely to decrease any more.

As described above, when the power supply voltage in the electronic circuit decreases to stop the circuit operation, the current value of a reference current IREF that is the output of the current generation circuit 403 decreases and approaches zero. Accordingly, the output current of the current mirror circuit also decreases, the voltage drop in the resistor 409 decreases, and the control signal VCTL becomes the low level. Because the gate potential of the NMOS FET 410 becomes the low level, the current-voltage conversion circuit 404 is turned off. In addition, because the PMOS FET 411 is turned on, the gate voltage at the transistor 402 is substantially equal to the output terminal voltage. Accordingly, the transistor 402 is turned off, impedance from the output terminal 112 to the power supply line in the electronic circuit increases, the current inflow from the output terminal 112 to the power supply line in the electronic circuit can be suppressed, and thus the intermediate potential of the output terminal 112 can be suppressed. For this reason, the potential of the output terminal 112 becomes the voltage substantially equal to the voltage pulled up on the side of the ECU 107, and it can be recognized that the power supply line is in the disconnected state. That is, the PMOS FET 411 serves as the switch that connects the gate terminal of the transistor 402 and the wiring to which the output terminal is connected during the disconnection.

Figure 5:
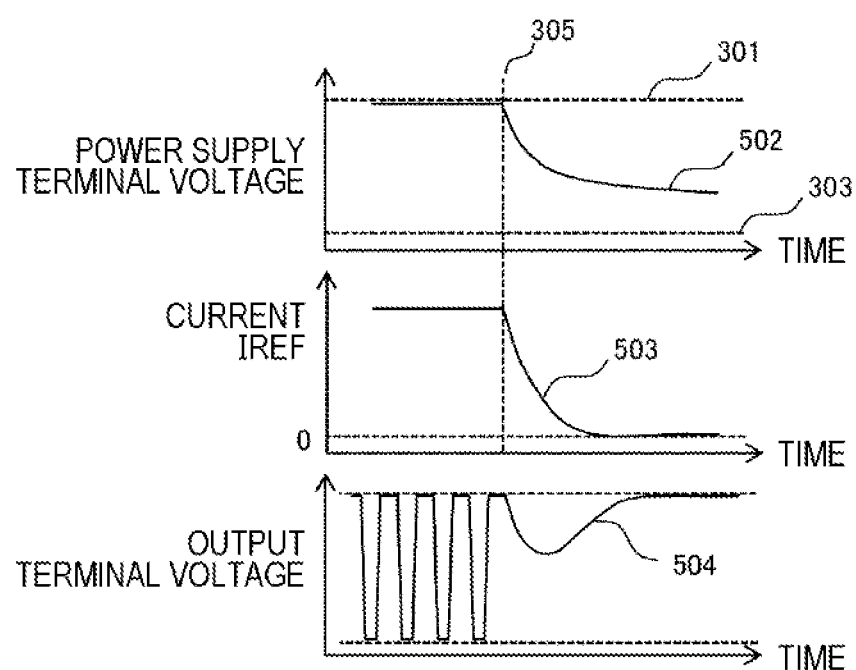
FIG. 5 is an operation waveform diagram illustrating the output circuit during the operation and during the disconnection of the power supply line of the first embodiment.

FIG. 5 is an operation waveform diagram illustrating the electronic circuit during the operation and during the disconnection of the power supply line of the first embodiment. In FIG. 5, the same function as that in FIG. 3 is denoted by the same reference numeral, and the description thereof will be omitted. In FIG. 5, the upper waveform indicates the voltage at the power supply terminal, the middle waveform indicates the current IREF in FIG. 4, and the lower waveform indicates the voltage at the output terminal. During the operation, the power supply voltage is supplied and the output signal is output. In addition, a reference current IREF (503) is generated, and a control voltage VCTL becomes the high level. When the power supply line is disconnected (305), the voltage at the power supply terminal decreases to some extent due to current consumption of the circuit (502). For this reason, the reference current IREF decreases and becomes substantially zero (503). Accordingly, the control voltage VCTL becomes the low level, the transistor 402 is turned off, and the output terminal voltage becomes the high level voltage substantially equal to the pull-up voltage.

As described above, the current is generated using the voltage connected to the power supply line in the electronic circuit, and the transistor is controlled using the voltage changed by the current, so that the intermediate potential of the output terminal can be suppressed during the disconnection of the power supply line, the output impedance is increased to the high impedance, and the high-level output can be implemented. In addition, the output terminal can be set to the high level using the current even in the case where the power supply terminal voltage does not fall lower than a certain level due to the disconnection of the power supply line during the operation or the like.

In this way, the electronic circuit in the first embodiment can set the voltage to the ground level even in the state where the power supply is cut off by generating the control voltage VCTL using the pull-down resistor.

Although the load has been described as the transistor in the first embodiment, the load is not limited thereto, and may be, for example, a resistor. The resistor is used as the load, so that the output resistor can have a substantially constant resistance value without depending on the output voltage. A positional relationship between the load and the transistor is not limited thereto.

The power consumption can be reduced by cutting off the reference current IREF at the time of standby when the circuit operation does not need.

The power supply voltage, the current value of the current mirror, the resistance value, and the operation thereof will be described below. However, the present invention is not limited thereto because this is an example. The power supply voltage is set to 5 V. The reference current IREF, the current to be mirrored, and the pull-down resistor are set as follows. For example, it is assumed that 10 µA is used as the reference current IREF. The mirror ratio may be 1:1, or for example, may be 1:4 with a gain of four times. When the mirror current is set as 40 µA and when the pull-down resistor is set as 300 kΩ, the voltage becomes 12 V when the current of 40 uA flows through the pull-down resistor. In practice, because the power supply voltage is 5 V, the source-drain voltage at the PMOS FET decreases and enters a non-saturation region. The control voltage is a value close to the power supply voltage and slightly less than 5 V. That is, during the normal operation, the control voltage is 5 V that is substantially equal to the power supply voltage. On the other hand, when the power supply line is disconnected, the power supply terminal voltage drops and the mirror current decreases. Assuming that the threshold voltage at the NMOS FET is 0.9 V, when the current decreases to about 3 µA, the current falls below the threshold voltage at the NMOS FET, and the NMOS FET is turned off.

As described above, the control voltage can be set to the high level during the normal operation by designing the product of the output current of the current mirror and the pull-down resistor to be sufficiently higher than the power supply voltage, and the transistor can be certainly turned on.

In the current generation circuit 403, a circuit that outputs the current, such as generation using a bandgap reference circuit, is used. In addition, the circuit that generates the current using the voltage obtained by voltage conversion or the like using a regulator as the power supply may be used instead of the directly use of the voltage applied to the power supply terminal.

The positional relationship between the load and the transistor of the first embodiment may be reversed. That is, the control may be performed by installing a transistor between the load and the power supply line in the electronic circuit.

The configuration in which the current-voltage conversion circuit 404 uses the current mirror and the resistor has been described, but the present invention is not limited thereto. Specifically, for example, the control voltage may be generated by a current-voltage conversion circuit using an operational amplifier and a resistor.

As described above, according to the first embodiment, because the on and off of the transistor is controlled using the control voltage that changes according to the change in the current generated using the power supply terminal voltage, the transistor can be appropriately controlled at the time of disconnection of the power supply line. Accordingly, the high-level potential can be output when the disconnection is generated, and the circuit in which the accuracy of the disconnection detection is improved can be provided.

Second Embodiment

Figure 6:
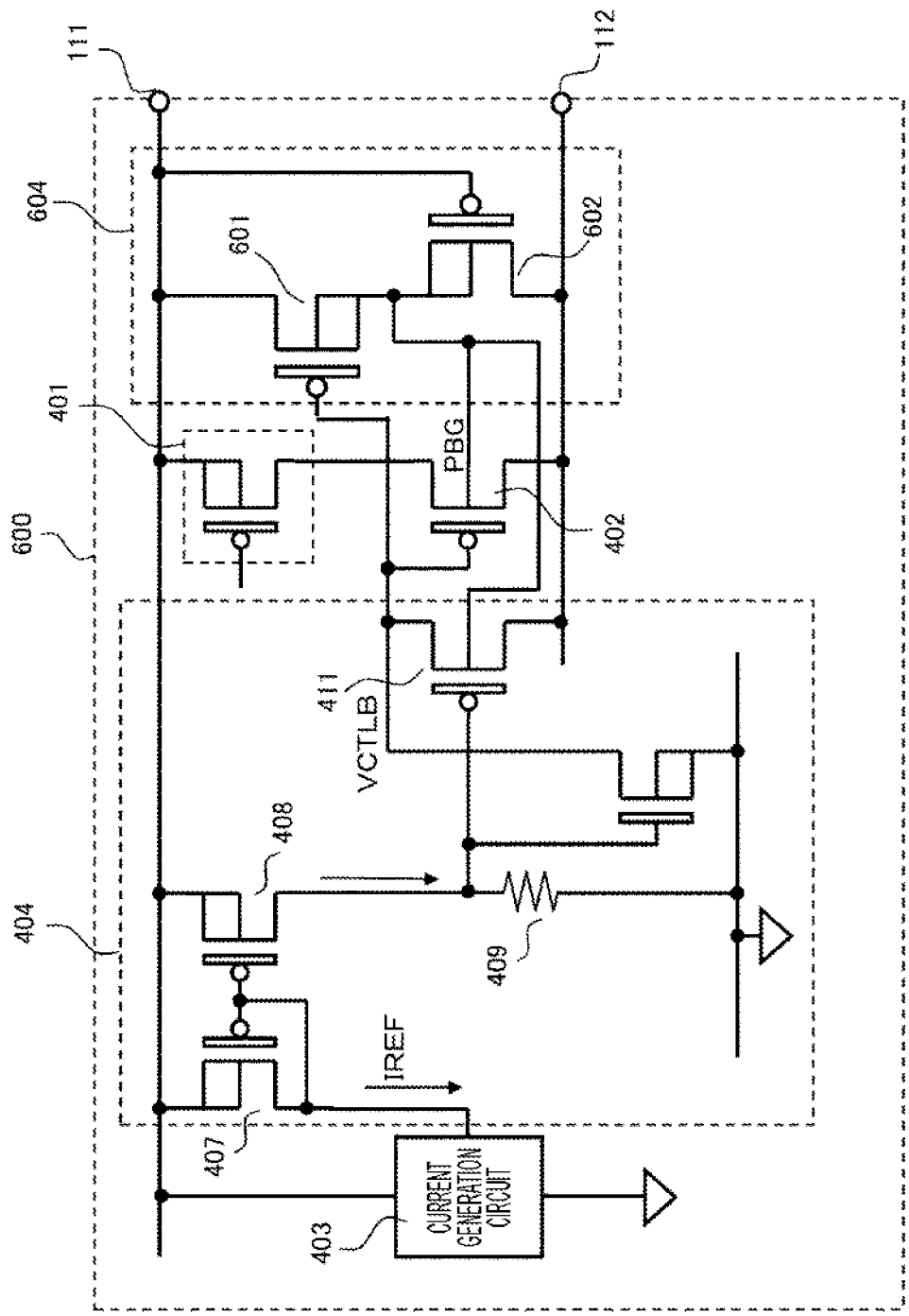
FIG. 6 is a schematic configuration diagram illustrating an electronic circuit according to a second embodiment.

FIG. 6 is a schematic configuration diagram illustrating an electronic circuit equipped with an output circuit in a second embodiment. In FIG. 6, the same function as that in FIG. 4 is denoted by the same reference numeral, and the description thereof will be omitted. In FIG. 6, an electronic circuit 600 includes the load 401, the transistor 402, the current generation circuit 403, the current-voltage conversion circuit 404, the power supply terminal 111, the output terminal 112, and a substrate control circuit 604. The substrate control circuit 604 includes PMOS FETs 601, 602. When the transistor 402 is constituted by the PMOS FET, parasitic diodes exist between the drain terminal and the back gate terminal and between the source terminal and the back gate terminal. Thus, in order to prevent the current from flowing by turning on the parasitic diode, it is necessary to connect the back gate terminal of the transistor 402 to the high potential. Specifically, the back gate terminal of the transistor 402 is controlled to be connected to the power supply voltage during the operation, and to be connected to the output voltage at the output terminal during the disconnection of the power supply line. During the operation, because a control voltage VCTLB is at the low level, the PMOS FET 601 is turned on, the back gate terminal of the transistor 402 is connected to the power supply voltage, and the power supply voltage is maintained. When the power supply line is disconnected, because the output terminal voltage becomes higher than the power supply voltage, the PMOS FET 601 is turned off, the PMOS FET 602 is turned on, and the back gate terminal voltage at the transistor 402 is connected to the output terminal voltage.

In addition, the gate voltage at the transistor 402 is controlled using the current of the current generation circuit 403 that generates the current using the power from the power supply line in the electronic circuit, and using the voltage in which the current-voltage conversion is performed by the current-voltage conversion circuit 404. As described above, the back gate terminal voltage at the transistor 402 is controlled and the gate voltage is controlled using the voltage passing through the current generation circuit 403 and the current-voltage conversion circuit 404, so that the electronic circuit of the output terminal is in the high impedance state during the disconnection of the power supply line and the high level is output.

Third Embodiment

Figure 7:
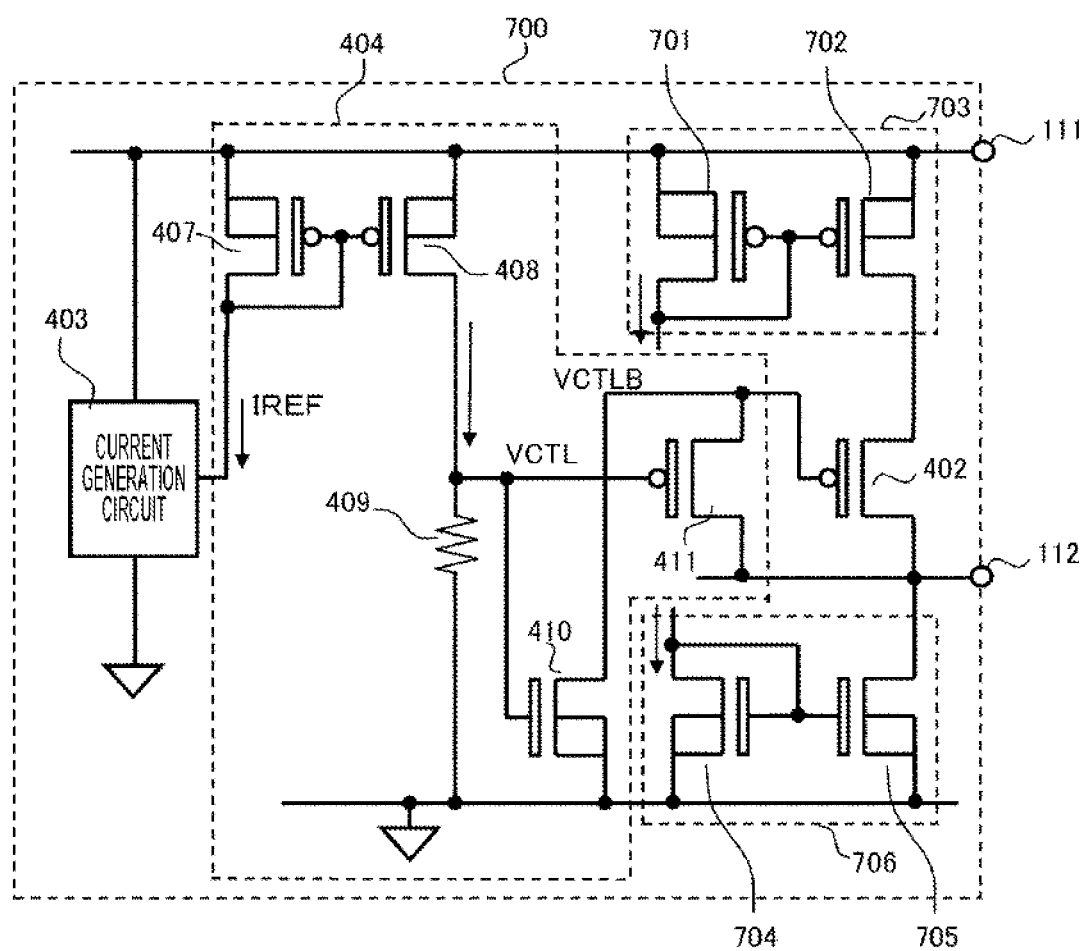
FIG. 7 is a schematic configuration diagram illustrating an electronic circuit according to a third embodiment.

FIG. 7 is a schematic configuration diagram illustrating an electronic circuit equipped with an output circuit in a third embodiment. In FIG. 7, the same function as that in FIG. 4 is denoted by the same reference numeral, and the description thereof will be omitted. In FIG. 7, an electronic circuit 700 includes loads 703, 706, the transistor 402, the current generation circuit 403, the current-voltage conversion circuit 404, the power supply terminal 111, and the output terminal 112. The loads 703, 706 are current mirror circuits in which the output is driven by a constant current. The output current mirror circuit includes NMOS FETs 704, 705 on the sink side as the load 706 and PMOS FETs 701, 702 on the source side as the load 703. The current mirror circuit is provided on each of the sink side and the source side, and rising and falling of the output signal are driven by constant current drive. The output load can be appropriately driven by performing the constant current output. For example, the driving is performed with the current of about several mA to about 10 mA. Assuming that the amplitude of the output signal is 5 V and that the output current is 5 mA, the output resistance becomes 1 kΩ when the potential difference is 5 V. For example, when the potential difference is 1 V, the output resistance is 200Ω. The value of the output resistor is smaller than that of the pull-up resistor. Thus, when the power supply line is disconnected, the transistor 402 needs to be turned off or brought into a high impedance state. The current is generated by the current generation circuit 403, the current-voltage conversion is performed by the current-voltage conversion circuit 404, and the gate voltage at the transistor 402 is controlled, so that the transistor 402 is controlled to be turned on to become the low output impedance state during the operation, and the transistor 402 is controlled to be turned off to become the high output impedance state during the disconnection of the power supply line. In this way, when the power supply line is disconnected, current inflow to the output terminal is suppressed, and the high-level output can be performed.

Fourth Embodiment

Figure 8:
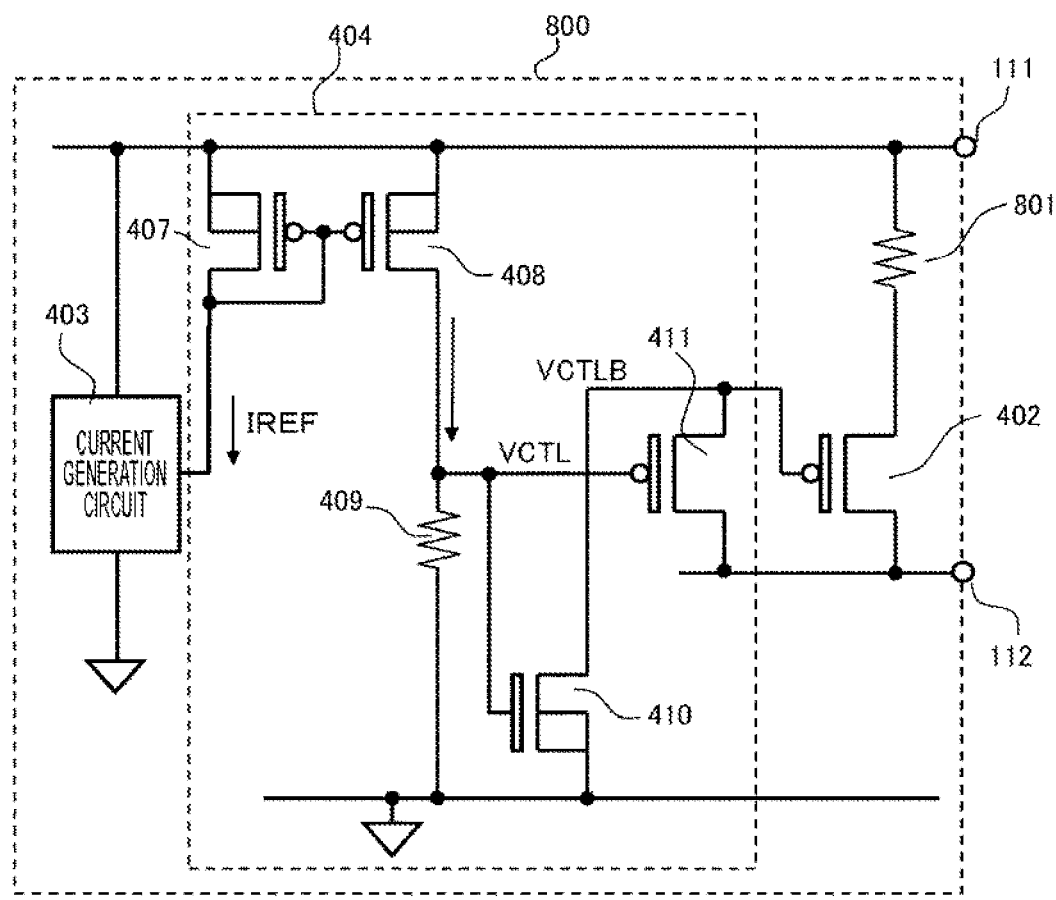
FIG. 8 is a schematic configuration diagram illustrating an electronic circuit according to a fourth embodiment.

FIG. 8 is a schematic configuration diagram illustrating an electronic circuit equipped with an output circuit in a fourth embodiment. In FIG. 8, the same function as that in FIG. 4 is denoted by the same reference numeral, and the description thereof will be omitted. FIG. 8 differs from FIG. 4 in that a load 801 is a resistor. As described above, the load may not be an active element such as the transistor but may be a passive element such as the resistor. In addition, a configuration in which the transistor and the resistor are combined may be used.

Fifth Embodiment

Figure 9:
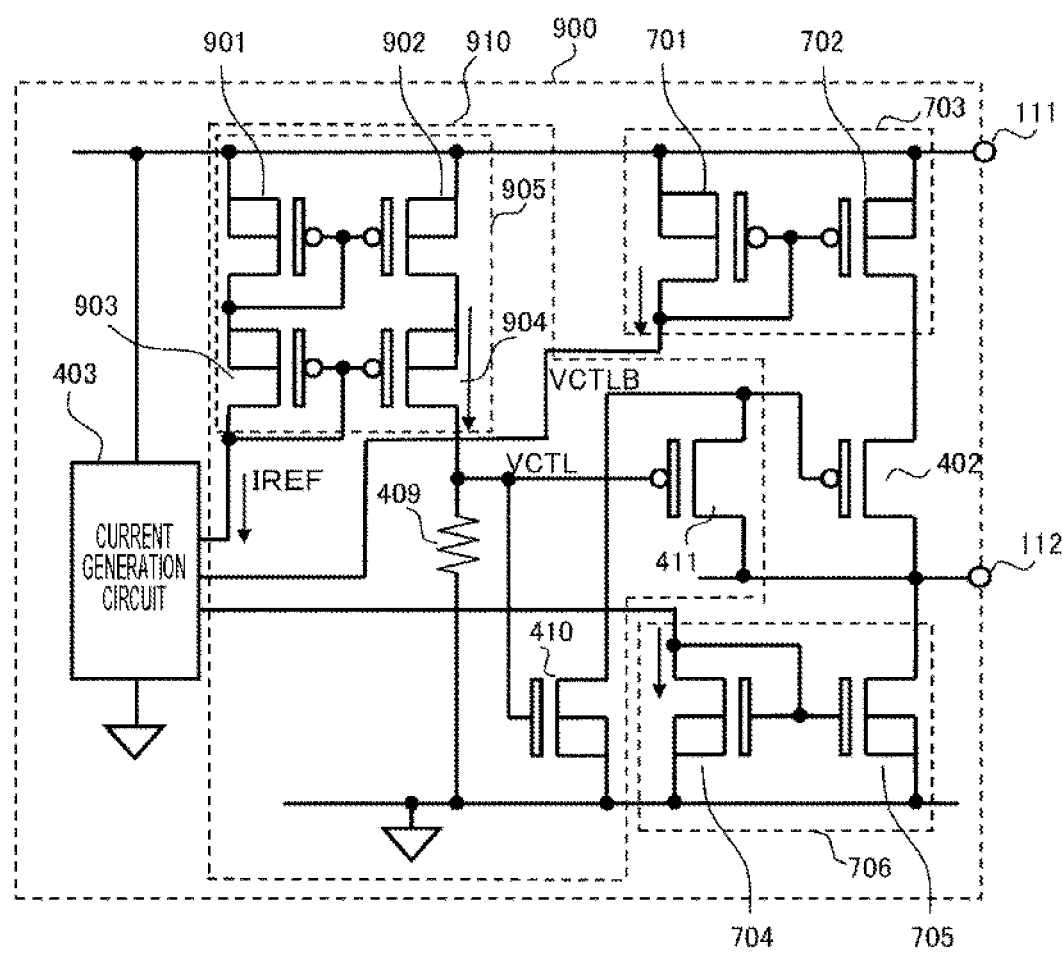
FIG. 9 is a schematic configuration diagram illustrating an electronic circuit according to a fifth embodiment.

FIG. 9 is a schematic configuration diagram illustrating an electronic circuit equipped with an output circuit in a fifth embodiment. In FIG. 9, the same function as that in FIG. 7 is denoted by the same reference numeral, and the description thereof will be omitted. FIG. 9 differs from FIG. 7 in that a current-voltage conversion circuit 910 includes a cascode-connected current mirror circuit 905. Specifically, the current mirror circuit 905 includes PMOS FETs 901, 902, 903, 904. When the power supply voltage decreases due to the cascode connection, the PMOS FET tends to operate in the non-saturation region, the mirrored current decreases at an early stage, and the potential of the control voltage VCTL decreases due to the pull-down resistor. Accordingly, the gate voltage at the transistor 402 is controlled by the control voltage VCTLB, and turned off.

The number of vertically stacked stages increases by cascode-connecting the current mirror circuit in this manner, and the current can be certainly cut off when the power supply terminal voltage decreases during the disconnection of the power supply line, and the high-level output can be performed. The current mirror circuit cuts off the current earlier than the current supply capability of the current generation circuit 403, so that the current generation circuit can be prevented from operating due to the current going around from the output terminal into the power supply line in the electronic circuit.

Sixth Embodiment

Figure 10:
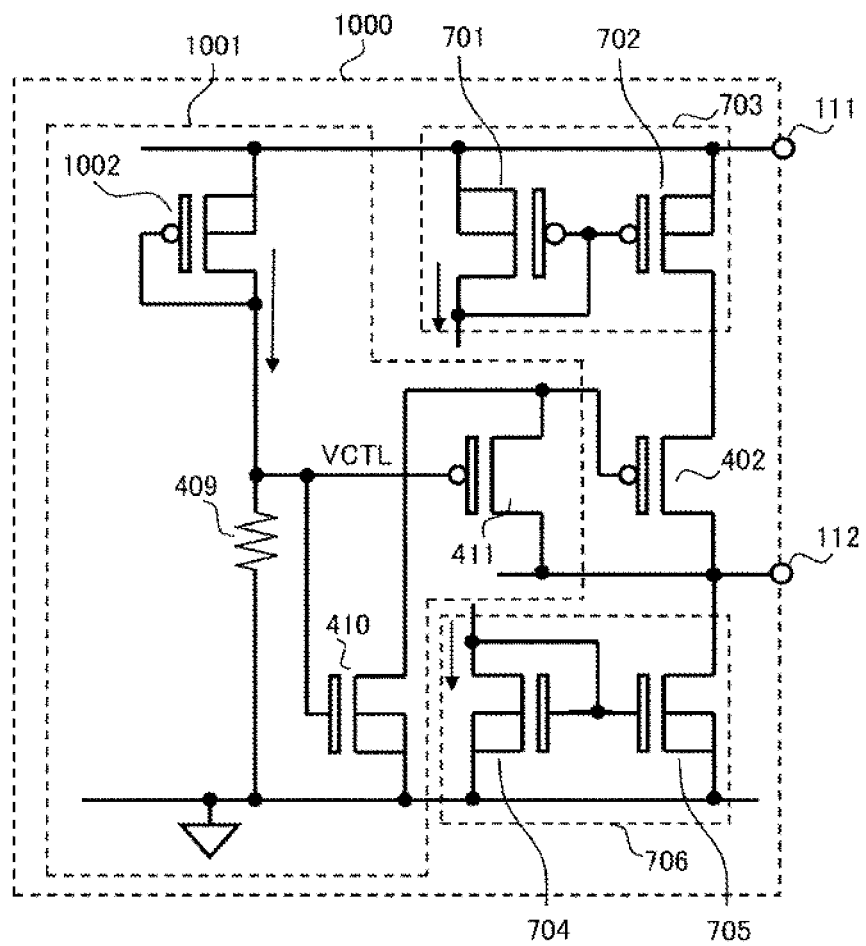
FIG. 10 is a schematic configuration diagram illustrating an electronic circuit according to a sixth embodiment.

FIG. 10 is a schematic configuration diagram illustrating an electronic circuit equipped with an output circuit in a sixth embodiment. In FIG. 10, the same function as that in FIG. 7 is denoted by the same reference numeral, and the description thereof will be omitted. In FIG. 10, an electronic circuit 1000 includes the loads 703, 706, the transistor 402, and a control voltage generation circuit 1001. Even when the power supply terminal voltage does not drop during the disconnection of the power supply line, the power supply terminal voltage is used by dropping the potential by a diode-connected PMOS FET 1002, so that the potential of the control voltage VCTL can be set lower than the threshold voltage at the NMOS FET 410. For this reason, even when the power supply terminal voltage does not decrease during the disconnection of the power supply line, the gate voltage at the transistor 402 can be controlled, and the transistor 402 can be turned off to suppress the intermediate potential of the output terminal voltage.

This element is not limited to the PMOS FET, but a constant voltage diode or the like may be used. Alternatively, the resistor is used, and the control may be performed using the voltage obtained by dividing the power supply voltage.

Although the embodiments have been described above, the present invention is not limited to the above-described embodiments, and various modifications are included. For example, the above embodiments are described in detail for the purpose of easy understanding of the present invention, and do not necessarily include all the described configurations. Furthermore, some components in one embodiment can be replaced with the components in another embodiment, and the configuration of another embodiment can be added to the configuration of one embodiment. Furthermore, another configuration can be added to, removed from, and substituted for a part of the configuration of each embodiment.

REFERENCE SIGNS LIST 101 sensor element
102 semiconductor electronic circuit
103 power supply circuit
104 analog circuit
105 processor
106, 201 output circuit
400, 600, 700, 800, 900, 1000 electronic circuit
107 ECU
108 power supply line
109 output wiring
110 ground wiring
111 power supply terminal
112 output terminal
113 ground terminal
202 control circuit
203, 204, 401, 703, 706, 801 load
402 transistor
403 current generation circuit
404, 910 current-voltage conversion circuit
407, 408, 411, 601, 602, 701, 702, 901, 902, 903, 904, 1002 PMOS FET
409 resistor
410, 704, 705 NMOS FET
604 substrate control circuit
905 current mirror circuit
1001 control voltage generation circuit

The invention claimed is:

1. An electronic circuit comprising:
a load provided between a power line and an output terminal in the electronic circuit;
a transistor provided between the load and the output terminal;
a current generation circuit that generates current using a power supply voltage at the power line in the electronic circuit; and
a control circuit that controls the transistor using a control voltage that changes according to the current generated by the current generation circuit,
wherein the power supply voltage changes due to disconnection of the power line in the electronic circuit, and the control circuit controls on and off of a gate terminal of the transistor using the control voltage, and
wherein a back gate terminal of the transistor is connected to the power supply voltage during operation of the electronic circuit, and
during the disconnection, control is performed so as to be connected to an output voltage at the output terminal.

2. The electronic circuit according to claim 1, wherein the control circuit controls the gate terminal of the transistor such that the transistor is turned on during the operation of the electronic circuit, and such that the transistor is turned off during the disconnection.

3. The electronic circuit according to claim 2, wherein the transistor is turned off at a predetermined voltage at which the power supply voltage is higher than a ground level during the disconnection.

4. An electronic circuit comprising:
a load provided between a power line and an output terminal in the electronic circuit;
a transistor provided between the load and the output terminal;
a current generation circuit that generates current using a power supply voltage at the power line in the electronic circuit;
a control circuit that controls the transistor using a control voltage that changes according to the current generated by the current generation circuit;
a current mirror circuit and a pull-down resistor that change the control voltage according to a current change generated by the current generation circuit between the current generation circuit and the transistor,
wherein the power supply voltage changes due to disconnection of the power line in the electronic circuit, the control circuit controls on and off of a gate terminal of the transistor using the control voltage, and wherein the pull-down resistor is connected between an output of the current mirror circuit and a ground.

5. The electronic circuit according to claim 4, wherein a product of a designed output current value of the current mirror circuit and a resistance value of the pull-down resistor is higher than a voltage supplied to the power line during operation.

6. An electronic circuit comprising:
a load provided between a power line and an output terminal in the electronic circuit;
a transistor provided between the load and the output terminal;
a current generation circuit that generates current using a power supply voltage at the power line in the electronic circuit;
a control circuit that controls the transistor using a control voltage that changes according to the current generated by the current generation circuit;
a current mirror circuit and a pull-down resistor that change the control voltage according to a current change generated by the current generation circuit between the current generation circuit and the transistor,
wherein the power supply voltage changes due to disconnection of the power line in the electronic circuit,
the control circuit controls on and off of a gate terminal of the transistor using the control voltage, and
the current mirror circuit has a configuration in which PMOS FETs are cascode-connected.

7. The electronic circuit according to claim 6, wherein during the disconnection, an output current of the current mirror circuit decreases faster than the current generated by the current generation circuit.

8. The electronic circuit according to claim 6, further comprising a switch that connects a gate terminal of the transistor and a wiring to which the output terminal is connected during the disconnection.

* * * * *